(12) United States Patent
Irifune et al.

(10) Patent No.: US 11,527,661 B2
(45) Date of Patent: Dec. 13, 2022

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Hiroyuki Irifune, Kobe Hyogo (JP); Hiroshi Kono, Himeji Hyogo (JP); Makoto Mizukami, Ibo Hyogo (JP); Shuji Kamata, Himeji Hyogo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/377,352

(22) Filed: Jul. 15, 2021

(65) Prior Publication Data
US 2022/0093805 A1    Mar. 24, 2022

(30) Foreign Application Priority Data
Sep. 18, 2020  (JP) .............................. JP2020-157903

(51) Int. Cl.
*H01L 29/872*  (2006.01)
*H01L 27/06*  (2006.01)
(Continued)

(52) U.S. Cl.
CPC ........ *H01L 29/872* (2013.01); *H01L 27/0629* (2013.01); *H01L 29/1608* (2013.01); *H01L 29/475* (2013.01)

(58) Field of Classification Search
CPC . H01L 29/1608; H01L 29/475; H01L 29/872; H01L 27/0629
(Continued)

(56) References Cited

U.S. PATENT DOCUMENTS 9,818,835 B2    11/2017  Kaneko et al.
10,374,075 B2    8/2019  Tominaga et al.
(Continued)

FOREIGN PATENT DOCUMENTS

JP    2009-277755 A    11/2009
JP    2013-080762 A    5/2013
(Continued)

*Primary Examiner* — Monica D Harrison
(74) *Attorney, Agent, or Firm* — Kim & Stewart LLP

(57) ABSTRACT

A semiconductor device includes a first electrode, a second electrode, a first semiconductor layer of a first conductivity type, a second semiconductor layer of a second conductivity type; a third semiconductor layer of the first conductivity type; a first active region; and a third electrode. The first semiconductor layer is located between the first electrode and the second electrode. The second semiconductor layer is located above the first semiconductor layer. The first active region is next to the second semiconductor layer in a second direction. The first active region includes a first upper portion and a first upper portion. An average value of a width in the second direction of the first lower portion is greater than an average value of a width in the second direction of the first upper portion. The third semiconductor layer is electrically connected with the second electrode.

9 Claims, 6 Drawing Sheets

(51) Int. Cl.
*H01L 29/16* (2006.01)
*H01L 29/47* (2006.01)

(58) Field of Classification Search
USPC .......................................................... 257/337
See application file for complete search history.

(56) References Cited

U.S. PATENT DOCUMENTS

2010/0308390 A1* 12/2010 Puget ................. H01L 27/1085
257/E27.084
2021/0083094 A1 3/2021 Sakaguchi et al.

FOREIGN PATENT DOCUMENTS

| JP | 2014-170886 A | 9/2014 |
| JP | WO2017-081935 A | 5/2017 |
| JP | 2018-125550 A | 8/2018 |
| JP | WO2018-139556 A | 8/2018 |

* cited by examiner

SEMICONDUCTOR DEVICE

CROSS-REFERENCE TO RELATED APPLICATIONS

This application is based upon and claims the benefit of priority from Japanese Patent Application No. 2020-157903, filed on Sep. 18, 2020; the entire contents of which are incorporated herein by reference.

FIELD

Embodiments relate to a semiconductor device.

BACKGROUND

A Schottky barrier diode (Schottky diode (SBD)) may be provided together with a MOSFET (Metal-Oxide-Semiconductor Field-Effect-Transistor) that includes a semiconductor part including silicon carbide (SiC) to suppress the operation of a parasitic diode. It is desirable to further increase the reliability of such a semiconductor device.

DETAILED DESCRIPTION

Figure 1:
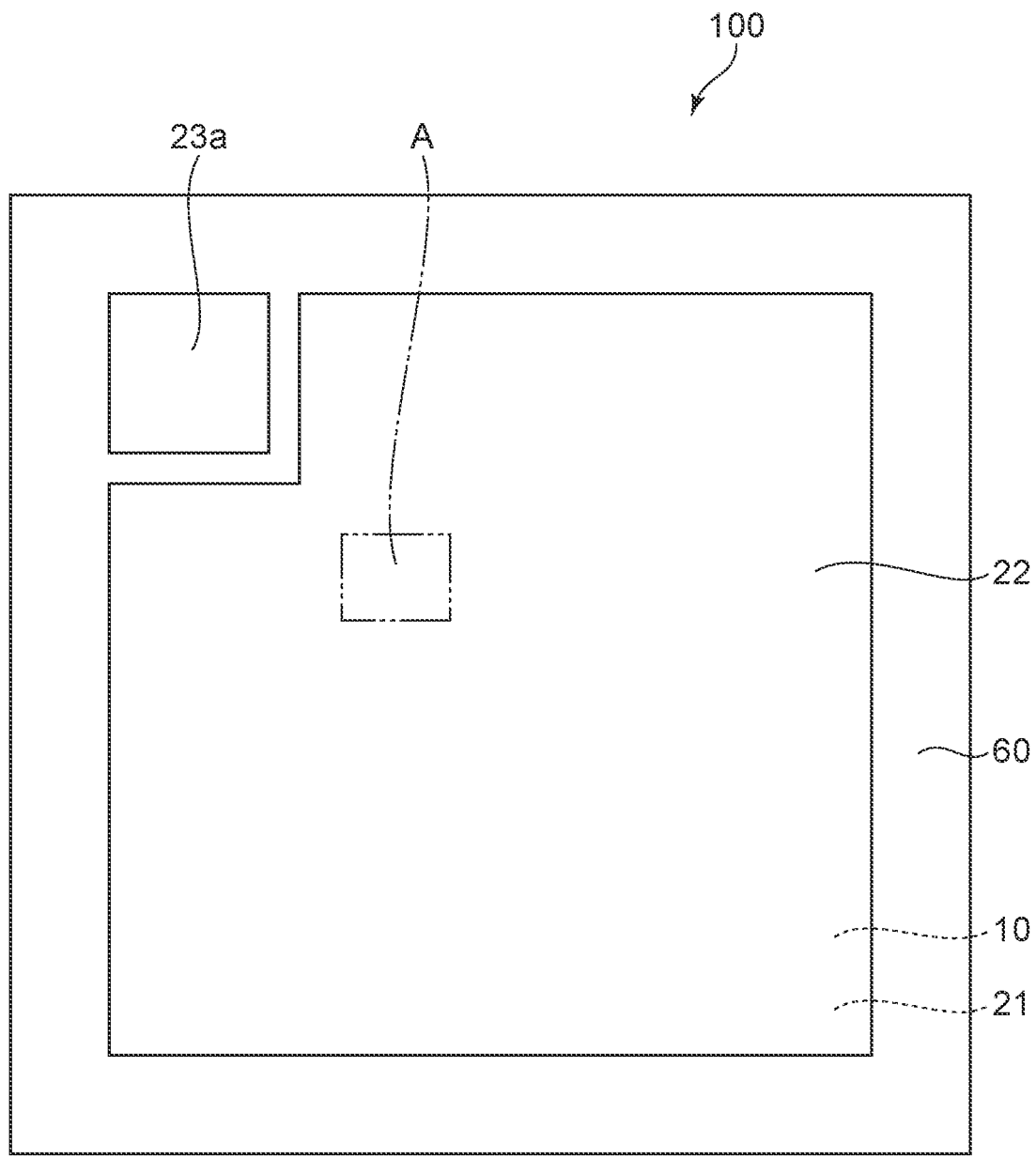
FIG. 1 is a plan view showing a semiconductor device according to a first embodiment.

A semiconductor device according to an embodiment includes a first electrode; a second electrode; a first semiconductor layer being of a first conductivity type; a second semiconductor layer being of a second conductivity type; a third semiconductor layer being of the first conductivity type; a first active region; and a third electrode. The first semiconductor layer is located between the first electrode and the second electrode. The second semiconductor layer is located between the first semiconductor layer and the second electrode. The first active region is next to the second semiconductor layer in a second direction orthogonal to a first direction. The first direction is from the first electrode toward the second electrode. The first active region includes a first upper portion and a first upper portion. The first upper portion is positioned between the first semiconductor layer and the second electrode. The first lower portion is positioned between the first semiconductor layer and the first upper portion. An average value of a width in the second direction of the first lower portion is greater than an average value of a width in the second direction of the first upper portion. The third semiconductor layer is located between the second semiconductor layer and the second electrode. The third semiconductor layer is electrically connected with the second electrode. The third electrode is located, with an insulating film and an insulating layer interposed, between the second electrode and the first active region and between the second electrode and the second and third semiconductor layers.

A semiconductor device according to an embodiment includes a first electrode; a second electrode; a first semiconductor layer being of a first conductivity type; a second semiconductor layer being of a second conductivity type; and an active region. The first semiconductor layer is located between the first electrode and the second electrode. The second semiconductor layer is located between the first semiconductor layer and the second electrode. The active region is next to the second semiconductor layer in a second direction orthogonal to a first direction. The first direction is from the first electrode toward the second electrode. The active region includes an upper portion and a lower portion. The upper portion is located between the first semiconductor layer and the second electrode. The upper portion contacts the second electrode. The lower portion is positioned between the first semiconductor layer and the upper portion. An average value of a width in the second direction of the lower portion is greater than an average value of a width in the second direction of the upper portion.

Various embodiments are described below with reference to the accompanying drawings.

The drawings are schematic and conceptual; and the relationships between the thickness and width of portions, the proportional coefficients of sizes among portions, etc., are not necessarily the same as the actual values thereof. Furthermore, the dimensions and proportional coefficients may be illustrated differently among drawings, even for identical portions. In the specification of the application and the drawings, components similar to those described in regard to an antecedent drawing are marked with like reference numerals, and a detailed description is omitted as appropriate.

First Embodiment

Figure 2:
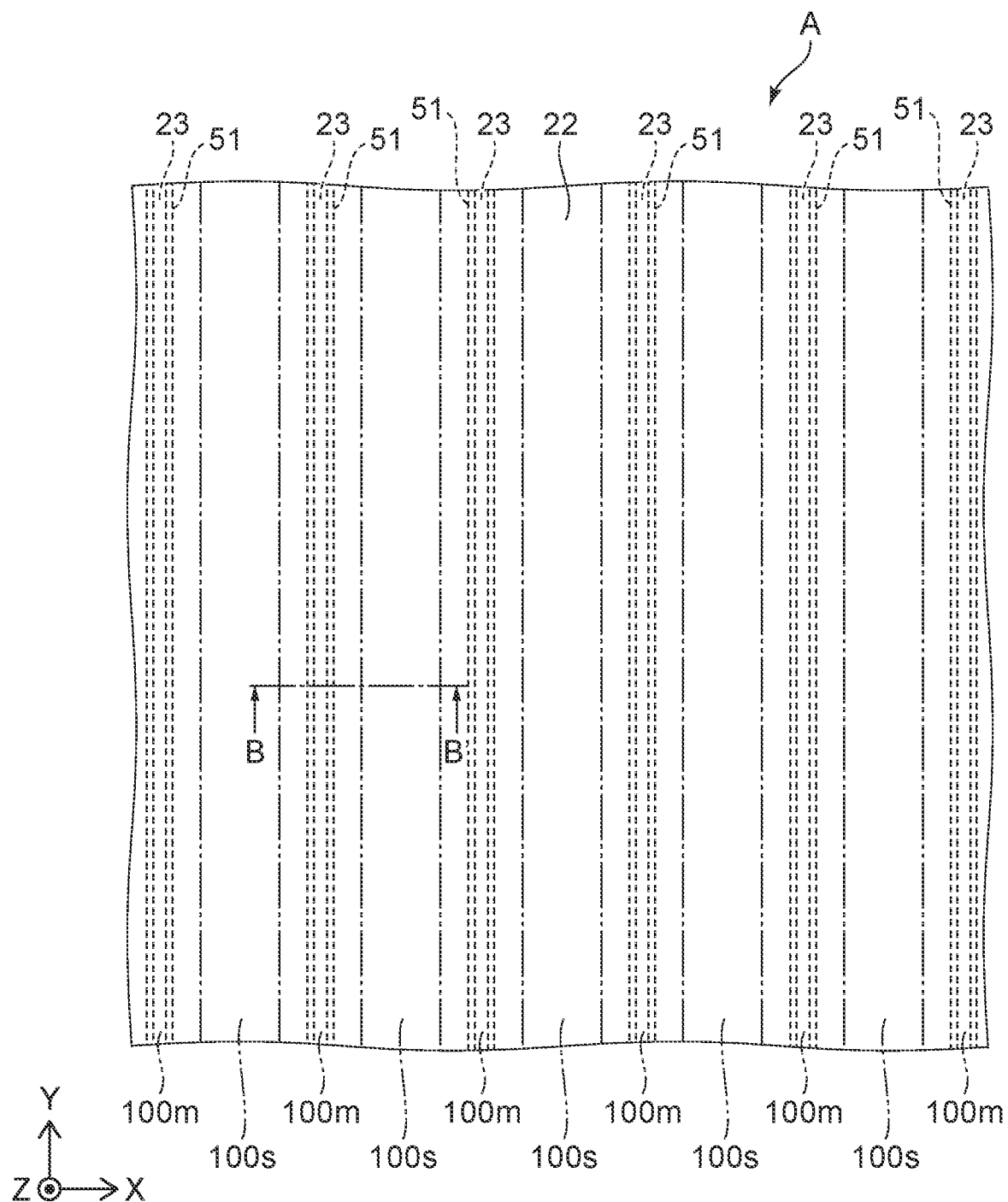
FIG. 2 is an enlarged plan view showing region A of FIG. 1.
Figure 3:
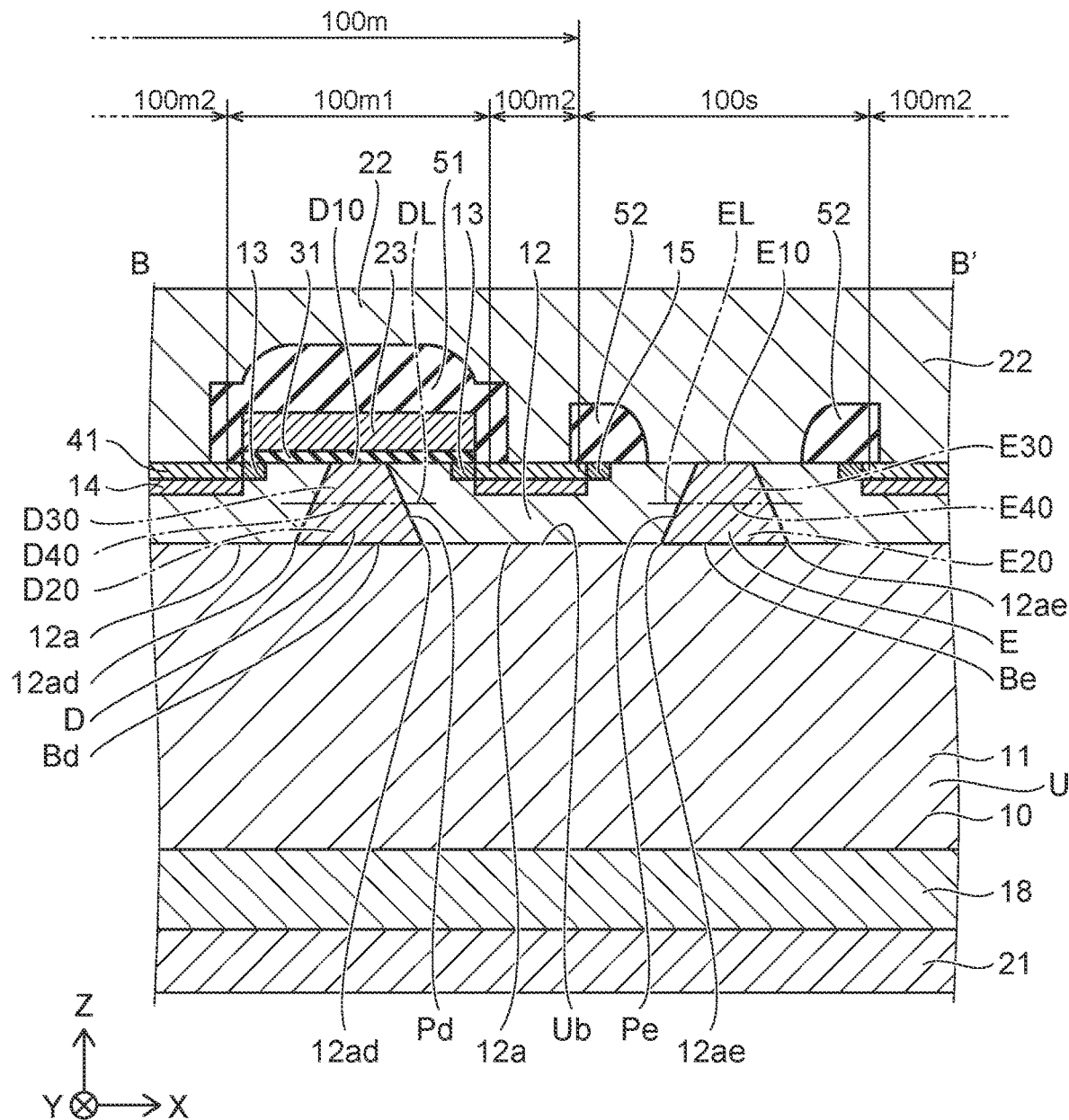
FIG. 3 is a cross-sectional view along line B-B' shown in FIG. 2.

FIG. 1 is a plan view showing a semiconductor device according to the embodiment. FIG. 2 is an enlarged plan view showing region A of FIG. 1. FIG. 3 is a cross-sectional view along line B-B' shown in FIG. 2. Protective films and wiring layers are not illustrated in FIGS. 1 to 3.

As shown in FIGS. 1 to 3, the semiconductor device 100 according to the embodiment is a power semiconductor device used to control current, and to which a voltage of, for example, about 3.3 kV is applied. As shown in FIGS. 1 and 3, a first electrode 21 is located at the lower surface of the semiconductor device 100. A second electrode 22 and a pad 23a are located at the upper surface of the cell region of the semiconductor device 100. The second electrode 22 is larger than the gate pad 23a. A terminal insulating film 60 is located at the upper surface of the termination region of the semiconductor device 100. As shown in FIG. 2, multiple MOSFETs 100m and multiple SBDs 100s are alternately arranged in the semiconductor device 100.

As shown in FIG. 3, the MOSFET 100m includes a gate control part 100m1 and a parasitic diode part 100m2. The gate control part 100m1 causes current to flow into a connected external device and controls the current amount. The parasitic diode part 100m2 includes body diodes formed at two sides of the gate control part 100m1 and causes a current to flow from the source electrode toward the drain electrode. The SBD 100s is a diode that includes the source electrode of the MOSFET 100m, the drain electrode of the MOSFET 100m, and a semiconductor part 10 positioned between the source and drain electrodes of the MOSFET 100m.

The semiconductor device 100 includes the semiconductor part 10, the first electrode 21, the second electrode 22, a third electrode 23, an insulating film 31, a contact 41, and insulating layers 51 and 52.

The first electrode 21 is, for example, a drain electrode. The first electrode 21 is substantially plate-shaped and is formed at, for example, the entire lower surface of the semiconductor device 100. The first electrode 21 includes, for example, aluminum (Al).

The semiconductor part 10 includes, for example, silicon carbide (SiC). The semiconductor part 10 includes an $n^+$-type buffer layer 18, an $n^-$-type drift layer 11 (a first semiconductor layer), a p-type base layer 12 (a second semiconductor layer), an $n^+$-type source layer 13 (a third semiconductor layer), a $p^+$-type contact layer 14 (a fourth semiconductor layer), and an n-type semiconductor layer 15. The "$n^+$-type" means that the carrier concentration is greater than that of the "n-type"; and the "$n^-$-type" means that the carrier concentration is less than that of the "n-type". This is similar for the p-type as well.

The $n^-$-type drift layer 11 is located on the $n^+$-type buffer layer 18. The $n^-$-type drift layer 11 is made of an n-type semiconductor but includes portions having different impurity concentrations. As shown in FIG. 3, the $n^-$-type drift layer 11 includes a first active region D and a second active region E. A portion of the $n^-$-type drift layer 11 other than the first and second active regions D and E is taken as a first region U. For example, the first region U is made of an $n^-$-type semiconductor.

The first active region D is a region of the gate control part 100m1 in which a current flows. The second active region E is a region of the SBD 100s in which a current flows. For example, the first active region D and the second active region E are made of an n-type semiconductor and are separated from each other via the p-type base layer 12.

The first region U is positioned under the first active region D, the second active region E, and the p-type base layer 12. As shown in FIG. 3, an upper surface Ub of the first region U contacts a lower surface 12a of the p-type base layer 12. A boundary Bd is the boundary between the first active region D and the first region U, and is the lower surface of the first active region D. The boundary Bd contacts an edge 12ad of the lower surface 12a of the p-type base layer 12 at the first active region D side. The boundary Bd is, for example, a region between two edges 12ad positioned at two sides of the first active region D.

Similarly, a boundary Be between the second active region E and the first region U is the lower surface of the second active region E; the boundary Be contacts an edge 12ae of the lower surface 12a of the p-type base layer 12 at the second active region E side; for example, the boundary Be is a region between two edges 12ae positioned at two sides of the second active region E. For example, the boundary Bd and the boundary Be include flat surfaces continuous with the lower surface 12a of the p-type base layer 12.

As shown in FIG. 3, the p-type base layer 12 is located on the $n^-$-type drift layer 11 in the MOSFET 100m and the SBD 100s, and is positioned between the first active region D and the second active region E of the $n^-$-type drift layer 11.

The $n^+$-type source layer 13 is a source layer of the MOSFET 100m. The $n^+$-type source layer 13 is located on the p-type base layer 12 and is separated from the first and second active regions D and E of the $n^-$-type drift layer 11 via the p-type base layer 12.

The $p^+$-type contact layer 14 is located on the p-type base layer 12 in the parasitic diode part 100m2. The $p^+$-type contact layer 14 is a contact layer of the parasitic diode part 100m2.

For example, the contact 41 has an ohmic contact with the parasitic diode part 100m2. The contact 41 is located on the $p^+$-type contact layer 14. For example, the contact 41 is formed of a salicide and includes, for example, nickel (Ni) and silicon (Si).

As shown in FIGS. 1 and 3, the second electrode 22 is, for example, a source electrode. The second electrode 22 is located on the semiconductor part 10. The second electrode 22 is connected to the p-type base layer 12 and the $n^+$-type source layer 13. The second electrode 22 contacts an upper surface E10 of the second active region E of the $n^-$-type drift layer 11. The second electrode 22 contacts the contact 41. The second electrode 22 includes, for example, aluminum.

The insulating film 31 is, for example, a gate insulating film. The insulating film 31 contacts the upper surfaces of the $n^-$-type drift layer 11 (the first active region D), the p-type base layer 12, and the $n^+$-type source layer 13. Specifically, the insulating film 31 contacts an upper surface D10 of the first active region D.

The third electrode 23 is, for example, a gate electrode. The third electrode 23 is located on the insulating film 31. The third electrode 23 faces the first active region D, the p-type base layer 12, and the $n^+$-type source layer 13 with the insulating film 31 interposed. As shown in FIG. 3, the third electrode 23 is separated from the second electrode 22 via an insulating layer 51. The third electrode 23 is electrically connected with the pad 23a.

The shape of the first active region D will now be elaborated.

When viewed in top-view as shown in FIGS. 2 and 3, the direction in which the MOSFET 100m extends is taken as a direction Y; a direction that is orthogonal to the direction Y from the first electrode 21 toward the second electrode 22 is taken as a direction Z; and a direction orthogonal to the direction Y and the direction Z is taken as a direction X. Hereinbelow, the width refers to the length along the direction X.

As shown in FIG. 3, the cross-sectional shape of the first active region D orthogonal to the direction Y is substantially trapezoidal. The first active region D includes the upper surface D10, and the boundary Bd that is the lower surface. In the first active region D, the width of the upper surface D10 that is the upper side of the trapezoid is less than the width of the boundary Bd that is the lower side of the trapezoid.

The shape of the first active region D will now be described further, and is set as follows.

As shown in FIG. 3, a first lower portion D20 and a first upper portion D30 of the first active region D are set by vertically bisecting the first active region D. As shown in FIG. 3, first, a bisector DL is set to be a line parallel to the direction X that bisects the length in the direction Z of the first active region D. The first lower portion D20 is the portion of the first active region D that is lower than the bisector DL; and the first upper portion D30 is the portion of the first active region D that is higher than the bisector DL. An internal boundary D40 partitions the first lower portion D20 and the first upper portion D30 and includes the bisector DL in the first active region D. For example, the width of the internal boundary D40 is equal to the length of the lower side of the first upper portion D30 and equal to the length of the upper side of the first lower portion D20.

The following are apparent in FIG. 3 in which the settings described above are used.

In the first active region D, the width of the upper surface D10 is less than the width of the boundary Bd. In the first active region D, the average value of the width of the first upper portion D30 is less than the average value of the width of the first lower portion D20. For example, the average value of the width is calculated by measuring the width of the portion or configuration of interest one location at a time for locations that are uniformly scattered in the Z-direction, and by dividing the sum total of the measured values by the number of measurement locations.

The width of the upper surface D10 is less than the average value of the width of the first upper portion D30. Also, the width of the upper surface D10 is less than the width of the internal boundary D40.

The width of the boundary Bd is greater than the average value of the width of the first lower portion D20. Also, the width of the boundary Bd is greater than the width of the internal boundary D40.

As shown in FIG. 3, the shape of the second active region E according to the embodiment is substantially the same as that of the first active region D. The cross-sectional shape of the second active region E orthogonal to the direction Y is substantially trapezoidal. The second active region E includes the upper surface E10, and the boundary Be that is the lower surface. In the second active region E, the width of the upper surface E10 that is the upper side of the trapezoid is less than the width of the boundary Be that is the lower side of the trapezoid.

The second active region E also is set similarly to the first active region D. A bisector EL, a second lower portion E20, a second upper portion E30, and an internal boundary E40 are set in the second active region E.

By using the settings described above, the following is apparent.

In the second active region E, the width of the upper surface E10 is less than the width of the boundary Be. In the second active region E, the average value of the width of the second upper portion E30 is less than the average value of the width of the second lower portion E20. The width of the upper surface E10 of the second active region E is less than the average value of the width of the second upper portion E30 and less than the average value of the width of the internal boundary E40. The width of the boundary Be is greater than the average value of the width of the second lower portion E20 and greater than the average value of the width of the internal boundary E40.

Although the first active region D and the second active region E have substantially the same shape in the semiconductor device 100 according to the embodiment, the shapes may be different. Also, the cross-sectional shapes of the first and second active regions D and E may not be substantially trapezoidal. For example, the cross-sectional shape of one of the first active region D or the second active region E may be rectangular or oval. It is sufficient for the shape of the XY cross section of at least one of the first active region D or the second active region E to be such that the average value of the width of the upper portion is less than the average value of the width of the lower portion. For example, it is favorable for the widths of the upper surfaces D10 and E10 to be less than the widths of the boundaries Bd and Be, and for the widths of the internal boundaries D40 and E40 that partition the upper portions D30 and E30 and the lower portions D20 and E20 to be wider than the upper surfaces D10 and E10 and narrower than the boundaries Bd and Be.

Although the change of the widths of the active regions D and E is evaluated in the embodiment by using the width of the internal boundary D40 and the average values of the widths of the upper portions D30 and E30 and the lower portions D20 and E20 when using the bisector DL to bisect the active regions D and E vertically, the evaluation is not limited thereto; the portion down to ⅓ of the height of the active region D may be taken as the upper portion; the remaining portion may be taken as the lower portion; and the change of the width of the active region may be evaluated using the internal boundary and the average values of the widths of the upper and lower portions.

Although the first active region D and the second active region E according to the embodiment are formed to be substantially trapezoidal as shown in FIG. 3 by using a multistage process in which multiple stages such as epitaxial growth, ion implantation, etching, etc., are used as appropriate, the formation is not limited thereto. The side boundaries Pd and Pe of the first active region D and the p-type base layer 12 may not be substantially planar. The side boundaries Pd and Pe may have multi-step staircase configurations.

Operations and effects of the semiconductor device 100 according to the embodiment will now be described.

The SBD 100s is provided together with the MOSFET 100m in the semiconductor device 100 according to the embodiment.

First, in the forward operation, a relatively positive potential is applied to the second electrode 22; and a relatively negative potential is applied to the first electrode 21. The operating voltage of the SBD 100s is less than the operating voltage of the MOSFET 100m; therefore, first, a current preferentially flows in the SBD 100s; and a current does not flow in the MOSFET 100m. In the SBD 100s, electrons flow into the second electrode 22 from the first electrode 21 by passing through the first region U and the second active region E. Thereby, the operation of the parasitic diode part 100m2 is suppressed up to a prescribed voltage. Meanwhile, injection of holes by the parasitic diode part 100m2 is suppressed; and a bipolar operation of the MOSFET 100m in which both electrons and holes flow is suppressed. In the semiconductor device 100, the expansion of crystal defects in the semiconductor part 10 that includes silicon carbide is suppressed thereby; and the degradation of device characteristics such as the D-S leakage characteristics for the forward voltage of the MOSFET 100m, etc., are suppressed.

In the off-state of the gate control part 100m1 in the reverse operation, a relatively negative potential is applied to the second electrode 22; a relatively positive potential is applied to the first electrode 21; and a relatively negative potential is applied to the third electrode 23. The electric field intensity of the insulating film 31 is greater in the off-state. Specifically, as shown in FIG. 3, the maximum electric field is at the center of the insulating film 31. Conversely, the dielectric breakdown is suppressed by relaxing the electric field intensity of the insulating film 31 by setting the width of the upper surface D10 of the first active region D to be narrow. Also, the side boundary Pd between the p-type base layer 12 and the first active region D is sloped by setting the width of the upper surface D10 of the first active region D to be less than the width of the boundary Bd. Thereby, the depletion layer in the first active region D can be sloped similarly to the side boundary Pd; and the depletion layer can be caused to gradually connect. A steep change of the electrostatic capacitance between the third electrode 23 and the first electrode 21 of the MOSFET 100m is suppressed thereby, and the occurrence of noise when switching is suppressed.

In the on-state of the gate control part 100m1 in the reverse operation, a relatively negative potential is applied to the second electrode 22; a relatively positive potential is applied to the first electrode 21; and a relatively positive potential is applied to the third electrode 23. Thereby, as shown in FIG. 3, a channel from the $n^+$-type source layer 13 is formed in the p-type base layer 12 between the $n^+$-type source layer 13 and the first active region D in a region directly under the third electrode 23. Electrons that are supplied from the $n^+$-type source layer 13 pass through the channel and flow into the first electrode 21. At this time, the channel length is longer by the amount that the upper surface D10 of the first active region D is narrow; however, an increase of the on-resistance is suppressed by increasing the width of the current path by widening the boundary Bd that is the lower surface.

If the width of the first active region D is substantially uniform, a so-called trade-off relationship exists between suppressing the electric field intensity of the insulating film by reducing the width and suppressing the on-resistance by increasing the width; however, in the semiconductor device 100 according to the embodiment, both problems are solved by setting the upper surface D10 of the first active region D to be narrow and setting the boundary Bd to be wide.

In the second active region E of the SBD 100s, the upper surface E10 is set to be narrow; and the boundary Be that is the lower surface is set to be wide. Thereby, in the SBD 100s, the leakage current is reduced by reducing the junction surface between the second electrode 22 and the second active region E; and the operating voltage is reduced by widening the boundary Be. Because the operating voltage of the SBD 100s is reduced, the start of the SBD 100s is earlier than that of the parasitic diode part 100m2, and the start of the parasitic diode part 100m2 is suppressed. The expansion of crystal defects in the semiconductor part is effectively suppressed thereby.

If the width of the second active region E is substantially uniform, a so-called trade-off relationship exists between reducing the width to reduce the leakage current and increasing the width to reduce the operating voltage; however, in the semiconductor device 100 according to the embodiment, both problems are solved by setting the upper surface D10 of the first active region D to be narrow and setting the boundary Bd to be wide.

In the semiconductor device 100 according to the embodiment as described above, the reliability and the operational performance can be improved.

First Modification of First Embodiment

In the semiconductor device 101 according to a modification, for example, the width difference between a first upper portion D31 and a first lower portion D21 of a first active region D1 is increased by further reducing the width of the first upper portion D31 and further increasing the width of the first lower portion D21. In other words, the cross-sectional shape of the first upper portion D31 and the cross-sectional shape of the first lower portion D21 each are substantially trapezoidal, and the length of the lower side of the first upper portion D31 is less than the length of the upper side of the first lower portion D21.

Figure 4:
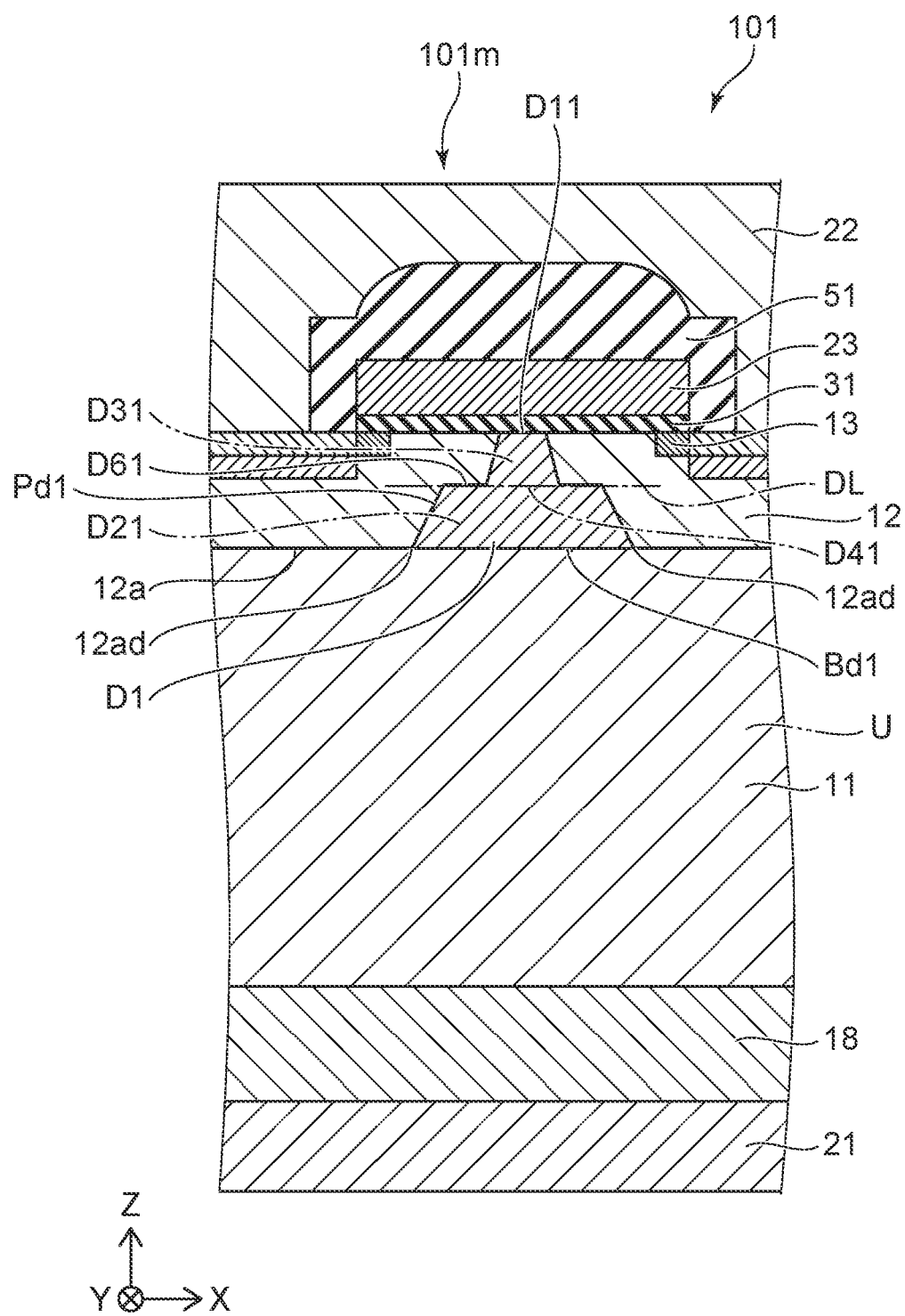
FIG. 4 is an enlarged cross-sectional view showing a MOSFET of a semiconductor device according to a first modification of the first embodiment.

FIG. 4 is an enlarged cross-sectional view showing a MOSFET of the semiconductor device according to the modification.

FIG. 4 shows a location similar to FIG. 3, and protective films and wiring layers are not illustrated.

In the first active region D1 of the modification as well, the width of an upper surface D11 is less than the width of a boundary Bd1 that is the lower surface. The shape of the first active region D1 will now be described further, and is set as follows.

The bisector DL, the first lower portion D21, the first upper portion D31, and an internal boundary D41 are set in the first active region D1 as shown in FIG. 4.

The following is apparent in FIG. 4 in which the settings described above are used.

In the first active region D1, the width of the first upper portion D31 is set to be less than the width of the first upper portion D30 according to the first embodiment; and the width of the first lower portion D21 is set to be greater than the width of the first lower portion D20 according to the first embodiment. Thereby, a notch surface D61 is formed at the internal boundary D41 between the first upper portion D31 and the first lower portion D21. A side boundary Pd1 includes one step due to the notch surface D61.

In the first active region D1, the width of the first upper portion D31 is less than the width of the first lower portion D21. In the first active region D1, the average value of the width of the first upper portion D31 is less than the average value of the width of the first lower portion D21.

The width of the upper surface D11 is less than the average value of the width of the first upper portion D31. Also, the width of the upper surface D11 is less than the width of the internal boundary D41.

The width of the boundary Bd1 that is the lower surface is greater than the average value of the width of the first lower portion D21. Or, the width of the boundary Bd1 is greater than the average value of the width of the internal boundary D41.

In the modification, the second active region has a shape similar to the first active region D1.

In the first active region D1 according to the modification, the upper surface D11 can be even narrower, and the boundary Bd1 can be even wider. The effects according to the first embodiment can be further improved thereby.

Otherwise, the configuration, the operations, and the effects of the modification are similar to those of the first embodiment.

Second Modification of First Embodiment

In a semiconductor device 102 according to a modification, the semiconductor part 10 includes, for example, silicon (Si); and a first active region D2 is formed in the semiconductor part 10 in, for example, two locations along the direction Z by performing thermal diffusion after ion implantation of an impurity.

Figure 5:
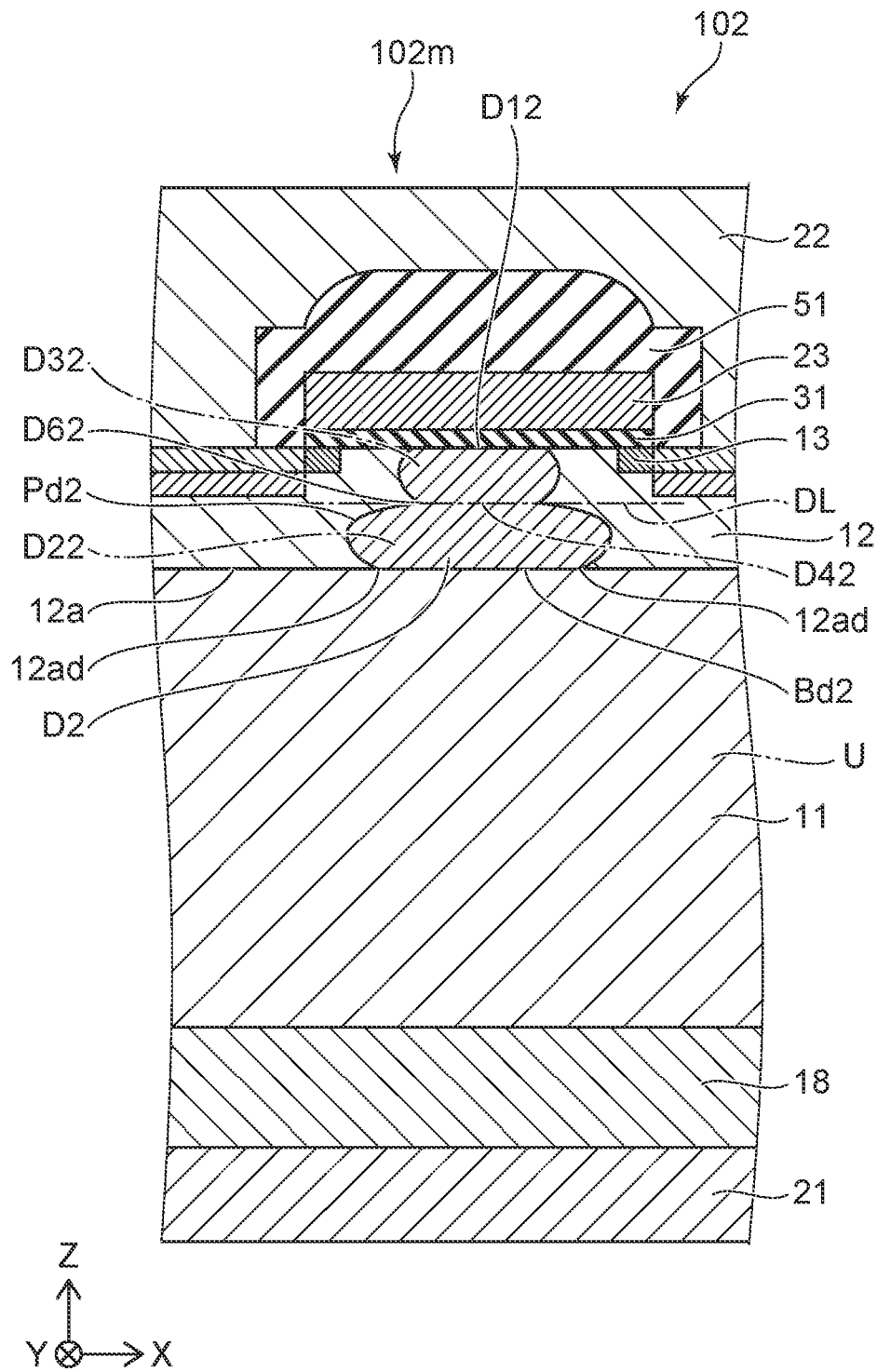
FIG. 5 is an enlarged cross-sectional view showing a MOSFET of a semiconductor device according to a second modification of the first embodiment.

FIG. 5 is an enlarged cross-sectional view showing a MOSFET of the semiconductor device according to the modification.

FIG. 5 shows a location similar to FIG. 3, and protective films and wiring layers are not illustrated.

The shape of the first active region D2 of the modification is similarly set as follows.

As shown in FIG. 5, a first upper portion D32 and a first lower portion D22 are formed by thermal diffusion of an impurity; therefore, the widths are widest at the central portions in the direction Z. In other words, the cross-sectional shape of the first upper portion D32 is oval, the cross-sectional shape of a first lower portion D22 also is oval, and the maximum diameter of the first upper portion D32 is less than the maximum diameter of the first lower portion D22. As shown in FIG. 5, an internal boundary D42 between the first upper portion D32 and the first lower portion D22 is a pinched-in surface D62. A side boundary Pd2 is a curved surface that is pinched-in at the pinched-in surface D62.

In the first active region D2, the width of the first upper portion D32 is less than the width of the first lower portion D22. In the first active region D2, the average value of the width of the first upper portion D32 is less than the average value of the width of the first lower portion D22.

The width of an upper surface D12 is less than the average value of the width of the first upper portion D32. Because the internal boundary D42 is the pinched-in surface D62, the width of the upper surface D11 is not necessarily less than the width of the internal boundary D42.

On the other hand, the width of a boundary Bd2 is not necessarily greater than the average value of the width of the first lower portion D22. Also, because the internal boundary D42 is the pinched-in surface D62, the width of the boundary Bd2 is not necessarily greater than the width of the internal boundary D42.

Although the first active region D1 of the modification is formed in two stages by implanting an impurity into the two locations of the semiconductor part 10 along the direction Z, the configuration is not limited thereto; for example, the first active region D1 may be formed in three or more stages by implanting an impurity into three or more locations along the direction Z.

In the first active region D2 of the modification, for example, the widths of the first upper portion D32 and the first lower portion D22 at the central portions in the direction Z are widest due to the formation by performing thermal diffusion of the impurity. The width of the central portion in the direction Z is increased thereby, and the current path is wider even when the upper surface D12 of the first active region D2 is set to be narrower. Thereby, the on-resistance of the MOSFET 102m can be reduced, and the operating voltage of the SBD 100s can be reduced.

As described above, in the semiconductor device 102 according to the modification as well, the reliability and the operational performance can be improved.

Otherwise, the configuration, the operations, and the effects of the modification are similar to those of the first embodiment.

Third Modification of First Embodiment

In a semiconductor device 103 according to a modification, the semiconductor part 10 includes, for example, silicon carbide; and a first active region D3 is formed in the semiconductor part 10 by, for example, performing thermal diffusion after ion implantation of an impurity into, for example, three locations along the direction Z.

Figure 6:
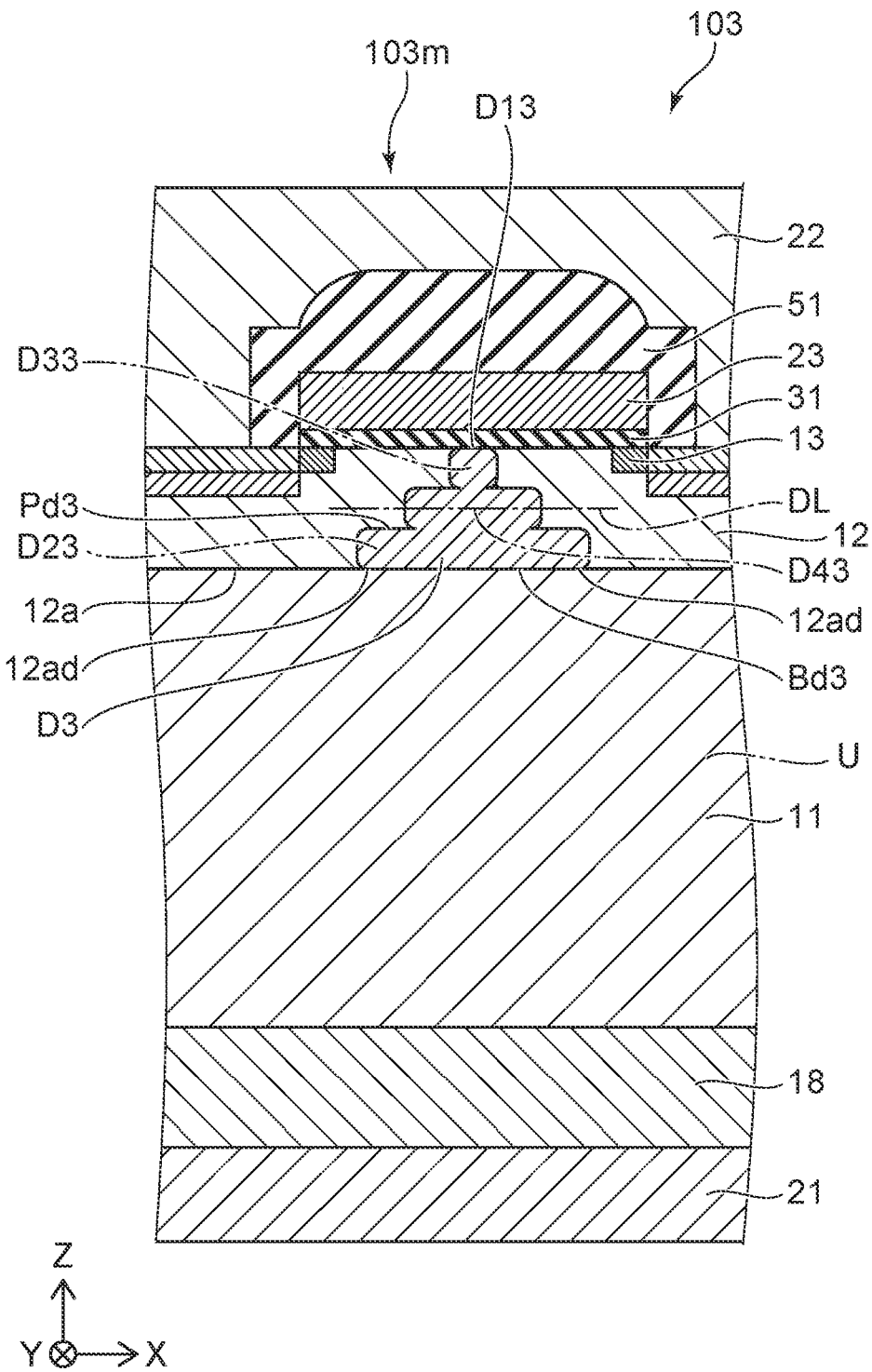
FIG. 6 is an enlarged cross-sectional view showing a MOSFET of a semiconductor device according to a third modification of the first embodiment.

FIG. 6 is an enlarged cross-sectional view showing a MOSFET of the semiconductor device according to the modification.

FIG. 6 shows a location similar to FIG. 3, and protective films and wiring layers are not illustrated.

As shown in FIG. 6, the first active region D3 is formed by performing ion implantation of an impurity into three locations in the direction Z and by performing thermal diffusion. Because the diffusion of the impurity is low in the modification, for example, the cross-sectional shape of the first active region D3 is substantially three rectangles that are overlaid.

In the first active region D3, the upper portion that is highest is narrowest; the lower portion that is lowest is widest; and the bisector DL is positioned at substantially the center of the portion positioned between the upper portion and the lower portion. For example, a side boundary Pd3 has a three-step staircase configuration.

The shape of the first active region D3 of the modification is similarly set as follows.

In the first active region D3, the average value of the width of a first upper portion D33 is less than the average value of the width of a first lower portion D23.

The width of an upper surface D13 is less than the average value of the width of the first upper portion D33. Also, the width of the upper surface D13 is less than the average value of the width of an internal boundary D43.

The width of a boundary Bd3 is not necessarily greater than the average value of the width of the first lower portion D23. The width of the boundary Bd3 is greater than the average value of the width of the internal boundary D43.

The second active region of the modification has a shape similar to that of the first active region D3.

In the modification, for example, the first active region D3 may be formed by epitaxial growth.

Otherwise, the configuration, the operations, and the effects of the modification are similar to those of the first embodiment.

According to embodiments of the invention, a semiconductor device can be provided in which the reliability can be increased.

Hereinabove, exemplary embodiments of the invention are described with reference to specific examples. However, the invention is not limited to these specific examples. For example, various modifications made by one skilled in the art in regard to the configurations, sizes, material qualities, arrangements, etc., of components of MOSFETs and SBDs included in semiconductor devices such as semiconductor parts, multiple electrodes, and insulating films are included in the scope of the invention to the extent that the purport of the invention is included. Any two or more components of the specific examples may be combined within the extent of technical feasibility and are included in the scope of the invention to the extent that the purport of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
    a first electrode;
    a second electrode;
    a first semiconductor layer located between the first electrode and the second electrode, the first semiconductor layer being of a first conductivity type;
    a second semiconductor layer located between the first semiconductor layer and the second electrode, the second semiconductor layer being of a second conductivity type;
    a first active region next to the second semiconductor layer in a second direction orthogonal to a first direction, the first direction being from the first electrode toward the second electrode, the first active region including
- a first upper portion positioned between the first semiconductor layer and the second electrode, and
- a first lower portion positioned between the first semiconductor layer and the first upper portion, an average value of a width in the second direction of the first lower portion being greater than an average value of a width in the second direction of the first upper portion;

a third semiconductor layer located between the second semiconductor layer and the second electrode, the third semiconductor layer being of the first conductivity type and being electrically connected with the second electrode; and a third electrode located, with an insulating film and an insulating layer interposed, between the second electrode and the first active region and between the second electrode and the second and third semiconductor layers.

2. The device according to claim 1, wherein a width of an upper surface of the first active region contacting the insulating film is less than the average value of the width of the first upper portion.

3. The device according to claim 1, wherein a width of an upper surface of the first active region contacting the insulating film is less than a width of an internal boundary between the first upper portion and the first lower portion.

4. The device according to claim 1, wherein
the first semiconductor layer further includes a first region positioned under the first active region and the second semiconductor layer,
an upper surface of the first region contacts lower surfaces of the first active region and the second semiconductor layer, and
a width of an upper surface of the first active region contacting the insulating film is less than a width of a first boundary between the first active region and the first region.

5. The device according to claim 1, further comprising:
a second active region located between the first region and the second electrode, the second active region contacting the second electrode and being next to the second semiconductor layer in a direction opposite to the second direction.

6. The device according to claim 5, wherein
the second active region includes a second upper portion and a second lower portion,
the second upper portion contacts the second electrode,
the second lower portion is positioned between the first region and the second upper portion, and
an average value of a width in the second direction of the second lower portion is greater than an average value of a width in the second direction of the second upper portion.

7. The device according to claim 6, wherein
a width of a second boundary between the second active region and the first region is greater than the average value of the width of the second lower portion.

8. The device according to claim 6, wherein
a width of a second boundary between the second active region and the first region is greater than a width of an internal boundary between the second upper portion and the second lower portion.

9. A semiconductor device, comprising:
a first electrode;
a second electrode;
a first semiconductor layer located between the first electrode and the second electrode, the first semiconductor layer being of a first conductivity type;
a second semiconductor layer located between the first semiconductor layer and the second electrode, the second semiconductor layer being of a second conductivity type; and
an active region next to the second semiconductor layer in a second direction orthogonal to a first direction, the first direction being from the first electrode toward the second electrode, the active region including
- an upper portion located between the first semiconductor layer and the second electrode, the upper portion contacting the second electrode, and
- a lower portion positioned between the first semiconductor layer and the upper portion, an average value of a width in the second direction of the lower portion being greater than an average value of a width in the second direction of the upper portion.

* * * * *